(12) United States Patent
Stachowiak

(10) Patent No.: US 6,967,060 B2
(45) Date of Patent: Nov. 22, 2005

(54) COATED ARTICLE WITH NIOBIUM ZIRCONIUM INCLUSIVE LAYER(S) AND METHOD OF MAKING SAME

(75) Inventor: Grzegorz Stachowiak, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 93 days.

(21) Appl. No.: 10/434,470

(22) Filed: May 9, 2003

(65) Prior Publication Data

US 2004/0224167 A1 Nov. 11, 2004

(51) Int. Cl.$^7$ .................................................. B32B 9/00
(52) U.S. Cl. ........................ 428/432; 428/428; 428/433; 428/697; 428/698; 428/699; 428/701; 428/702; 428/704
(58) Field of Search ................................. 428/428, 432, 428/433, 697, 698, 699, 701, 702, 704

(56) References Cited

U.S. PATENT DOCUMENTS

| | | | |
|---|---|---|---|
| 3,597,050 A | 8/1971 | Plumat | |
| 3,682,528 A | 8/1972 | Apfel et al. | |
| 4,898,790 A | 2/1990 | Finley | |
| 5,229,194 A | 7/1993 | Lingle et al. | |
| 5,342,675 A | 8/1994 | Kobayashi et al. | |
| 5,407,733 A | 4/1995 | Bjornard et al. | |
| 5,413,864 A | 5/1995 | Miyazaki et al. | |
| 5,514,476 A | 5/1996 | Hartig et al. | |
| 5,543,229 A | 8/1996 | Ohsaki et al. | |
| 5,557,462 A | 9/1996 | Hartig et al. | |
| 5,837,108 A | 11/1998 | Lingle et al. | |
| 5,935,702 A | 8/1999 | Macquart et al. | |
| 5,948,538 A | 9/1999 | Brochot et al. | |
| 6,045,896 A | 4/2000 | Boire et al. | |
| 6,086,210 A | 7/2000 | Krisko et al. | |
| 6,210,784 B1 | 4/2001 | Rondeau et al. | |
| 6,287,675 B1 | 9/2001 | Guiselin et al. | |
| 6,355,334 B1 | 3/2002 | Rondeau et al. | |
| 6,445,503 B1 | 9/2002 | Lingle | |
| 6,514,620 B1 | 2/2003 | Lingle et al. | |
| 6,524,688 B1 | 2/2003 | Eby et al. | |
| 6,524,714 B1 | 2/2003 | Neuman et al. | |
| 6,558,800 B1 | 5/2003 | Stachowiak | |
| 6,576,349 B2 | 6/2003 | Lingle et al. | |
| 2002/0045037 A1 | 4/2002 | Boire et al. | |
| 2002/0064662 A1 | 5/2002 | Lingle et al. | |
| 2002/0086164 A1 * | 7/2002 | Anzaki et al. | 428/432 |
| 2002/0192473 A1 | 12/2002 | Gentilhomme et al. | |
| 2003/0049464 A1 | 3/2003 | Glenn et al. | |

FOREIGN PATENT DOCUMENTS

WO    WO 01/21540    3/2001
WO    WO 2004/011382    2/2004

OTHER PUBLICATIONS

"Heat Insulating Glass Which Can Be Thermally Worked", Hironobu, 05124839, Oct. 1991.
U.S. Appl. No. 10/423,058 filed Apr. 25, 2003 (copy attached).

* cited by examiner

Primary Examiner—Deborah Jones
Assistant Examiner—G. Blackwell-Rudasill
(74) Attorney, Agent, or Firm—Nixon & Vanderhye P.C.

(57) ABSTRACT

A coated article is provided so as to include a coating (e.g., low-E coating, or the like) having at least one layer of or including niobium zirconium (NbZr). The NbZr layer may be metallic in certain example embodiments. Alternatively, an oxide and/or nitride of NbZr may be provided in other example embodiments. The NbZr inclusive layer may be provided as any suitable layer of the multi-layer coating, but in certain example instances may be used as a contact layer adjacent to an infrared (IR) reflecting layer. Coated articles herein may be used in the context of insulating glass (IG) window units, laminated windows, architectural or residential monolithic window units, vehicle window units, and/or the like.

44 Claims, 4 Drawing Sheets

COATED ARTICLE WITH NIOBIUM ZIRCONIUM INCLUSIVE LAYER(S) AND METHOD OF MAKING SAME

This application relates to a coated article for use in a window or the like, wherein the coated article includes a niobium zirconium inclusive layer(s). In certain example non-limiting instances, the niobium zirconium inclusive layer(s) may be used as a barrier layer or contact layer located immediately adjacent and contacting an infrared (IR) reflecting layer such as a silver layer.

BACKGROUND OF THE INVENTION

Windows including glass substrates with solar control coatings provided thereon are known in the art. Such windows may be used in the context of architectural windows, insulating glass (IG) window units, automotive windows, and/or the like.

U.S. Pat. No. 5,514,476 discloses a coated article having a layer stack of glass/SiN/NiCr/Ag/NiCr/SiN, where SiN stands for silicon nitride. While such coatings are certainly good overall coatings usable in applications such as windshields and architectural windows, they tend to be problematic in certain respects. For example, while such layer stacks with NiCr contact layers (a "contact layer" is a layer which contacts an IR reflecting layer such as silver) provide efficient solar control and are overall good coatings, the NiCr layers are lacking in terms of: (a) corrosion resistance to acid (e.g., HCl boil); and/or (b) mechanical performance such as scratch resistance.

It is also known in the art to use niobium (Nb) as a material for contact layers. For example, U.S. Pat. No. 6,355,334 discloses the use of Nb as a contact layer to be provided immediately above a silver layer. U.S. Pat. No. 6,045,896 also discloses the use of Nb as a contact layer immediately above a silver layer. Unfortunately, Nb layers are also lacking with respect to chemical durability. In particular, Nb suffers damage when exposed to certain chemicals such as alkaline solutions, e.g., upon exposure to a one hour NaOH boil test for measuring durability. In commercial use, pinholes can form in the outer dielectric layer(s) thereby exposing the contact layer(s) in certain areas; and if it is damaged by alkaline solutions this can lead to durability issues and coating failure. For example, certain photographs in U.S. patent application Ser. No. 10/370,060, filed Feb. 21, 2003 (hereby incorporated herein by reference) illustrate that Nb layers are often damaged by the one hour NaOH boil test (one hour boil in solution including about 0.1 normal NaOH solution—0.4% NaOH mixed with water—at about 195 degrees F.). For the boil test, see ASTM D 1308-87, incorporated herein by reference.

Accordingly, there exists a need in the art for a coated article that has improved durability. A non-limiting example of improved durability is improved resistance to alkaline solutions thereby indicating improved chemical durability. It is an example purpose of certain embodiments of this invention to fulfill this need, and/or other needs which will become apparent to the skilled artisan once given the following disclosure.

BRIEF SUMMARY

In certain example embodiments of this invention, a coating or layer system is provided which includes a layer(s) comprising niobium zirconium (NbZr). In certain example embodiments, the layer(s) comprising NbZr may be used as a contact layer located immediately adjacent to and contacting an IR reflecting layer such as a silver (Ag) layer. The layer(s) comprising NbZr may be located above and/or below the IR reflecting layer. The layer(s) comprising NbZr may be metallic in certain embodiments of this invention, or in other embodiments of this invention may be an oxide and/or nitride of NbZr.

Surprisingly, it has been found that the addition of Zr to Nb causes the resulting layer (and thus the resulting coated article) to realize excellent chemical and mechanical durability, and also excellent thermal performance. For example, the use of NbZr, NbZrO$_x$ and/or NbZrN$_x$ may allow the resulting coated article(s) to achieve at least one of: (a) improved chemical durability such as corrosion resistance to alkaline solutions (e.g., NaOH) and/or acid such as HCl; (b) good thermal performance; and (c) good mechanical performance such as scratch resistance. Layers comprising NbZr are surprisingly more durable than both NiCr and Nb, and also show surprisingly good affinity (attraction) to silver and dielectric materials such as silicon nitride or the like.

In certain example non-limiting embodiments of this invention, the Zr:Nb ratio (atomic %) in the NbZr (or oxide and/or nitride thereof) layer(s) may be from about 0.001 to 1.0, more preferably from about 0.001 to 0.60, and even more preferably from about 0.004 to 0.50. In certain example embodiments, the layer(s) comprising NbZr (or oxide and/or nitride thereof) may include from about 0.1 to 60% Zr, more preferably from about 0.1 to 40% Zr, even more preferably from 0.1 to 20%, still more preferably from 0.1 to 15%, more preferably from about 0.4 to 15% Zr, and most preferably from 3 to 12% Zr (atomic %).

Certain example embodiments of this invention provide a coated article including a layer system supported by a substrate, the layer system comprising: at least first and second dielectric layers; an infrared (IR) reflecting layer comprising silver located between at least the first and second dielectric layers; and a layer comprising niobium zirconium located adjacent to and contacting the IR reflecting layer.

Other example embodiments of this invention provide a coated article including a layer system supported by a substrate, the layer system comprising: an infrared (IR) reflecting layer located between at least first and second other layers; and a layer comprising niobium zirconium located adjacent to and contacting the IR reflecting layer.

Still further example embodiments of this invention provide a coated article including a layer system supported by a glass substrate, the layer system comprising: a layer comprising an oxide of niobium zirconium supported by the substrate; and wherein the layer comprising niobium zirconium oxide has an index of refraction "n" of from 2.0 to 3.4, and comprises from about 0.1 to 60% Zr.

Other example embodiments of this invention provide a method of making a coated article, the method comprising: providing a glass substrate; and sputtering a target comprising niobium and zirconium in order to form a layer comprising niobium zirconium that is supported by the glass substrate.

DETAILED DESCRIPTION OF EXAMPLE EMBODIMENTS OF THE INVENTION

In certain example embodiments of this invention, coated articles may be provided so as to have at least one layer comprising niobium zirconium (NbZr). The layer(s) comprising NbZr may be used as a contact layer(s) immediately adjacent an IR reflecting layer such as silver in certain example embodiments of this invention. In certain embodiments, the NbZr layer(s) may be metallic and/or consist essentially of NbZr. However, in other example embodiments of this invention, the NbZr layer(s) may be at least partially oxided (oxidized) and/or nitrided. Certain example embodiments of this invention relate to double silver stacks, while others relate to single silver stacks, or other types of layer stacks.

Coated articles herein may be used in the context of insulating glass (IG) window units, architectural window units, residential window units (e.g., IG and/or monolithic), vehicle window units such as laminated windshields, backlites, or sidelites, and/or other suitable applications.

Figure 1:
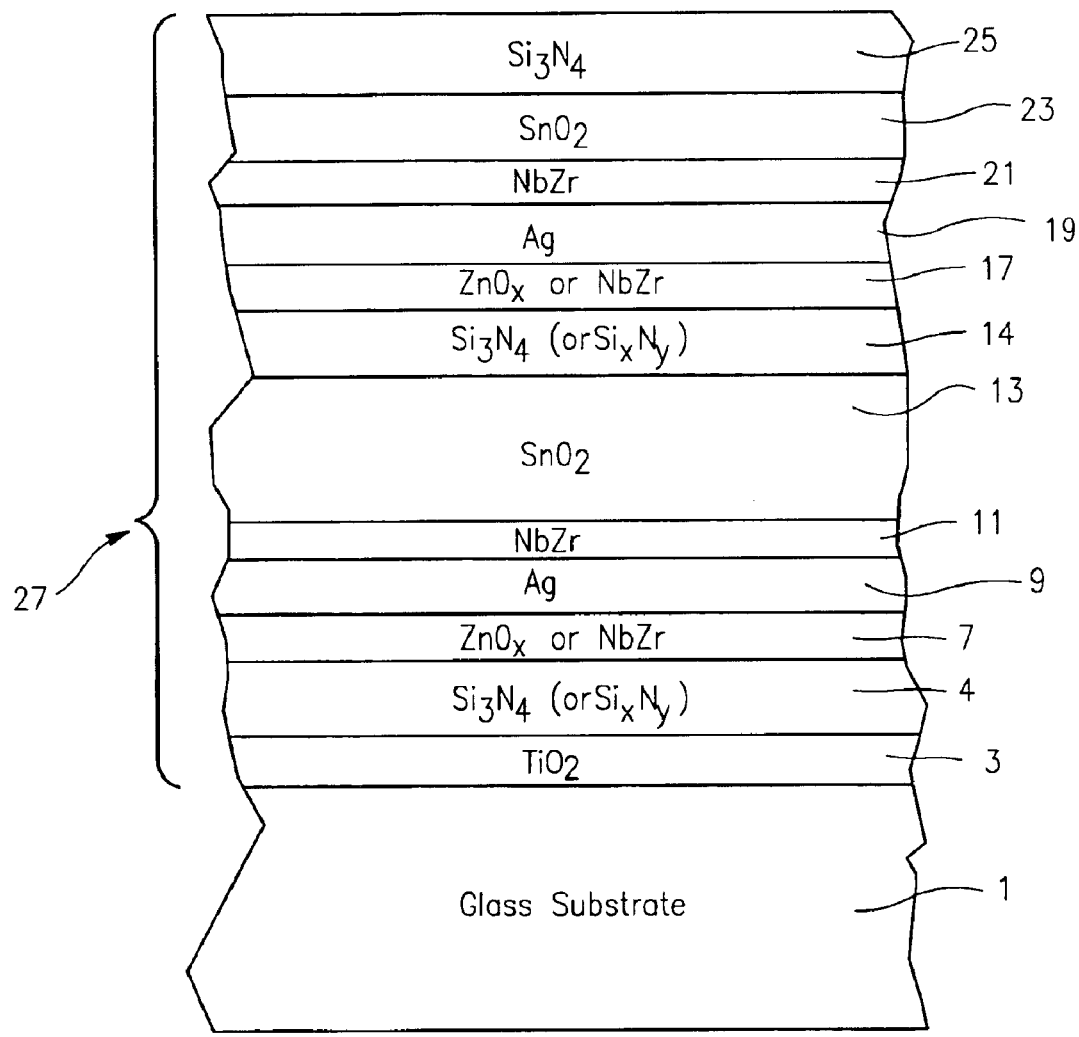
FIG. 1 is a cross sectional view of a coated article according to an example embodiment of this invention.

FIG. 1 is a side cross sectional view of a coated article according to an example non-limiting embodiment of this invention. The coated article includes substrate 1 (e.g., clear, green, bronze, or blue-green glass substrate from about 1.0 to 10.0 mm thick, more preferably from about 2 mm to 6 mm thick), and coating (or layer system) 27 provided on the substrate 1 either directly or indirectly. The coating (or layer system) 27 may include: optional titanium oxide layer 3 (a dielectric layer), silicon nitride layer 4 which may be $Si_3N_4$, or a Si-rich type (another dielectric layer), first lower contact layer 7 which contacts and protects IR reflecting layer 9, first conductive and potentially metallic infrared (IR) reflecting layer 9, first upper contact layer 11 which contacts and protects IR reflecting layer 9, dielectric layer 13, another silicon nitride inclusive layer 14 (another dielectric layer), second lower contact layer 17 which contacts and protects IR reflecting layer 19, second upper contact layer 21 which contacts and protects upper IR reflecting layer 19, dielectric layer 23, and finally protective dielectric layer 25. The "contact" layers 7, 11, 17 and 21 each contact at least one IR reflecting layer (e.g., Ag inclusive layer of Ag, an Ag alloy, or the like). The aforesaid layers 3–25 make up low-E (i.e., low emissivity) coating 27 which is provided on glass or plastic substrate 1.

Infrared (IR) reflecting layers 9 and 19 are preferably metallic and/or conductive, and may comprise or consist essentially of silver (Ag), gold, or any other suitable IR reflecting material. These IR reflecting layers 9, 19 help allow coating 27 to have low-E and/or good solar control characteristics. The IR reflecting layer(s) may be slightly oxidized in certain embodiments of this invention.

One or both of the upper contact layers 11 and 21 may be of or include NbZr. These layers 11, 21 may be metallic in certain example embodiments of this invention; although in other embodiments of this invention an oxide and/or nitride of NbZr may be provided for contact layer(s) 11 and/or 21. Surprisingly, it has been found that the addition of Zr to Nb causes the resulting NbZr inclusive layer (and thus the resulting coated article) to realize excellent chemical and mechanical durability, and also excellent thermal performance. For example, the use of NbZr, $NbZrO_x$ and/or $NbZrN_x$ in one or more of the contact layers of the coating may allow the resulting coated article(s) to achieve at least one of: (a) improved corrosion resistance to alkaline solutions such as NaOH and acid such as HCl; (b) good thermal performance; and (c) good mechanical performance such as scratch resistance. NbZr has been found to be surprisingly more durable than both NiCr and Nb. It has also been found that NbZr inclusive layers show surprisingly good affinity to silver which is an often-used IR reflecting layer. For example, NbZr inclusive layers have been found to have improved corrosion resistance to acids such as HCl compared to layers of NiCr; and improved corrosion resistance to alkaline solutions such as NaOH compared to layers of Nb. In other words, NiCr is problematic upon exposure to acids and Nb is problematic upon exposure to certain alkalines, while NbZr inclusive layers are satisfactory in both respects.

One or both of lower contact layers 7 and 17 may also be of or include NbZr in certain example embodiments of this invention. These layers 7, 17 may be metallic (e.g., consist essentially of NbZr) in certain example embodiments of this invention; although in other embodiments of this invention an oxide and/or nitride of NbZr may be provided for contact layer(s) 7 and/or 17. In alternative embodiments of this invention, one or both of lower contact layers 7, 17 need not comprise NbZr. In such alternative embodiments, one or both of lower contact layers 7, 17 may be of or include NiCr, Nb, $NiCrO_x$, $NiCrN_x$, $ZnO_x$, $ZnAlO_x$, Ni, Cr or the like. In certain embodiments of this invention, it is possible for one of the upper contact layers to be of or include one of these alternative materials.

In certain example non-limiting embodiments of this invention, the Zr:Nb ratio (atomic %) in the NbZr (or oxide and/or nitride thereof) layer(s) 7, 11, 17 and/or 21 may be from about 0.001 to 1.0, more preferably from about 0.001 to 0.60, and even more preferably from about 0.004 to 0.50. In certain example embodiments, the layer(s) comprising NbZr (or oxide and/or nitride thereof) may include from about 0.1 to 60% Zr, more preferably from about 0.1 to 40% Zr, even more preferably from 0.1 to 20%, still more preferably from 0.1 to 15%, more preferably from about 0.4 to 15% Zr, and most preferably from 3 to 12% Zr (atomic %).

In embodiments where the niobium zirconium layer(s) is of or includes $NbZrN_x$ (i.e., a nitride of NbZr), the ratio in the layer of nitrogen to the total combination of Nb and Zr may be represented, in certain example embodiments, by $(Nb+Zr)_xN_y$, where the ratio y/x (i.e., the ratio of N to Nb+Zr) is from 0 to 0.9, more preferably from 0.2 to 0.9, even more preferably from 0.3 to 0.8, still more preferably from 0.4 to 0.7. Such values may are be the case when the layer(s) is/are oxidized instead of or in addition to being nitrided.

In certain example embodiments of this invention, layers comprising niobium zirconium may have an index of refraction "n" of from about 2.0 to 3.4, more preferably from 2.2 to 2.8, and most preferably from 2.2 to 2.7. When such layers are fully oxidized for example, they may have an extinction coefficient "k" close to zero and an index "n" of around 2.3. When such layers are only partially oxidized, both "n" and "k" will increase so "n" will proceed above 2.3 and "k" will be above zero. However, when such NbZr inclusive layers are nitrided and/or very slightly oxidized, they may have an extinction coefficient "k" of from 2.0 to 3.5, more preferably from 2.4 to 3.2, and most preferably from 2.5 to 3.0 in certain examples of this invention.

In certain situations, the scratch resistance of a barrier/contact layer may not be as interesting as the scratch resistance of the overall layer system having a dielectric layer or the like on top. In such cases, it is desirable for at least one barrier/contact layer to be compatible with and overlying dielectric (i.e., be a good nucleation layer for the immediately overlying layer such as tin oxide or silicon nitride) so that the overlying dielectric can be grown dense and hard. Similarly, it is often desired that the barrier/contact layer be compatible with silver; and materials such as NiCr are sometimes problematic in this respect. According to certain example embodiments of this invention, barrier/contact layer(s) comprising NbZr are very compatible with both silver and dielectric materials such as tin oxide and silicon nitride, thereby allowing for good mechanical durability such as scratch resistance in certain example non-limiting embodiments.

Silicon nitride inclusive dielectric layer(s) 4 and/or 14 is/are provided so as to, among other things, improve heat-treatability of the coated articles (optional), e.g., such as thermal tempering or the like. Layers 4 and/or 14 may be stoichiometric silicon nitride (i.e., $Si_3N_4$) in certain example embodiments of this invention. However, in other embodiments of this invention, layers 4 and/or 14 may be non-stoichiometric silicon nitride such as Si-rich silicon nitride. In Si-rich embodiments, one or both of the potentially Si-rich silicon nitride layers 4 and/or 14 may be characterized by Si-rich layers described in U.S. 2002/0064662, the disclosure of which is hereby incorporated herein by reference. It has been found that the use of Si-rich silicon nitride in layer(s) 4 and/or 14 allows for haze to be reduced.

Dielectric layer 13 acts as a coupling layer between the two halves of the coating 27, and is of or includes tin oxide in certain embodiments of this invention. However, other dielectric materials may instead be used for layer 13. Dielectric layers 23 and 25 may allow the environmental resistance of the coating 27 to be improved, and are also provided for color purposes. In certain example embodiments, dielectric layer 23 may be of or include tin oxide (e.g., $SnO_2$), although other materials may instead be used. Dielectric overcoat layer 25 may be of or include silicon nitride (e.g., $Si_3N_4$) in certain embodiments of this invention, although other materials may instead be used. Layer 23 (and/or other layers in FIG. 1) may be omitted in certain example embodiments of this invention.

It is noted that the silicon nitride inclusive layers according to any embodiment herein (e.g., 4, 14 and/or 25) may optionally be doped with from about 0–20%, more preferably from about 5–10%, of a material such as aluminum or stainless steel in certain example embodiments of this invention. Even though such conductive materials may be provided in the layers 4, 14 and/or 25 in small amounts in certain instances, the layers are still considered dielectric layers herein since, among other things, they are oxide/nitride based and they are not very conductive if at all.

Other layer(s) below or above the illustrated coating 27 may also be provided. Thus, while the layer system or coating 27 is "on" or "supported by" substrate 1 (directly or indirectly), other layer(s) may be provided therebetween. Thus, for example, coating 27 of FIG. 1 may be considered "on" and "supported by" the substrate 1 even if other layer(s) are provided between layer 3 and substrate 1. Moreover, certain layers of coating 27 may be removed in certain embodiments, while others may be added between the various layers or the various layer(s) may be split with other layer(s) added between the split sections in other embodiments of this invention without departing from the overall spirit of certain embodiments of this invention. Furthermore, the materials illustrated in the drawings for the various layers and the number of layers illustrated are for purposes of example only, and are not limiting unless expressly claimed. As an example, while the dielectric layer 4 is shown as being of silicon nitride, this invention is not so limited as this dielectric layer may be of any other dielectric material such as titanium oxide, or any other suitable metal oxide and/or nitride. This applies to the other dielectric layers as well.

Figure 2:
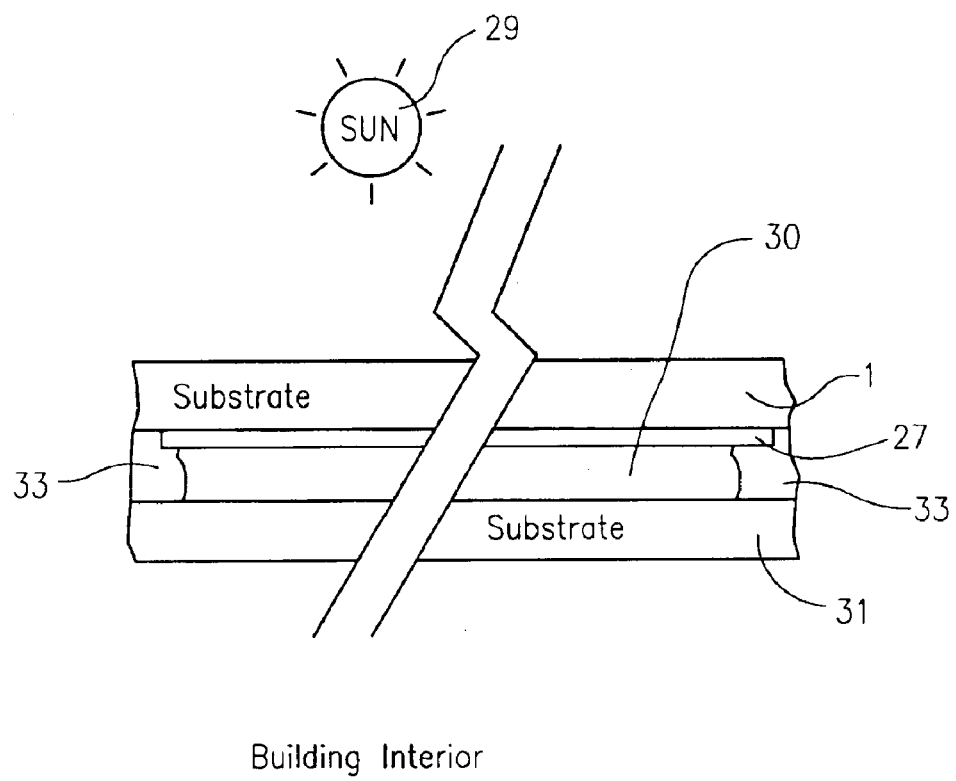
FIG. 2 is a cross sectional view of the coated article of FIG. 1 (or any other figure herein) being used in an IG window unit according to an example embodiment of this invention.

FIG. 2 illustrates the coating or layer system 27 being utilized on surface #2 of an IG window unit. Coatings 27 according to any embodiment herein may be used in IG units as shown in FIG. 2. In order to differentiate the "inside" of the IG unit from its "outside", the sun 29 is schematically presented on the outside. The IG unit includes outside glass pane or sheet (i.e., substrate 1) and inside glass pane or sheet 31. These two glass substrates (e.g. float glass 1–10 mm thick) are sealed at their peripheral edges by a conventional sealant and/or spacer 33 and may be provided with a conventional desiccant strip (not shown). The panes may then be retained in a conventional window or door retaining frame. By sealing the peripheral edges of the glass sheets and optionally replacing the air in insulating space (or chamber) 30 with a gas such as argon, a typical, high insulating value IG unit is formed. Optionally, insulating space 30 may be at a pressure less than atmospheric pressure in certain alternative embodiments (with or without a gas in space 30), although this of course is not necessary in all embodiments. While the inner side of substrate 1 is provided with coating 27 in FIG. 2, this invention is not so limited (e.g., coating 27 may instead be provided on the interior surface of substrate 31 in other embodiments of this invention).

Turning back to FIG. 1, while various thicknesses may be used in different embodiments of this invention, example thicknesses and materials for the respective layers on the glass substrate 1 in the FIG. 1 embodiment are as follows, from the glass substrate outwardly (thicknesses in angstroms):

TABLE 1

(Example Materials/Thicknesses; FIG. 1 Embodiment)

| Layer | Preferred Range (Å) | More Preferred (Å) | Example (Å) |
|---|---|---|---|
| $TiO_x$ (layer 3) | 0–400 Å | 20–150 Å | 40 Å |
| $Si_xN_y$ (layer 4) | 50–450 Å | 90–200 Å | 113 Å |
| $ZnO_x$ (layer 7) | 10–300 Å | 40–150 Å | 100 Å |
| Ag (layer 9) | 50–250 Å | 80–120 Å | 95 Å |
| NbZr (layer 11) | 3–200 Å | 3–50 Å | 10 Å |
| $SnO_2$ (layer 13) | 0–1,000 Å | 350–800 Å | 483 Å |
| $Si_xN_y$ (layer 14) | 0–450 Å | 90–200 Å | 113 Å |
| $ZnO_x$ (layer 17) | 10–300 Å | 40–150 Å | 100 Å |
| Ag (layer 19) | 50–250 Å | 80–220 Å | 131 Å |
| NbZr (layer 21) | 3–200 Å | 3–50 Å | 10 Å |
| $SnO_2$ (layer 23) | 0–750 Å | 70–200 Å | 100 Å |
| $Si_3N_4$ (layer 25) | 0–750 Å | 120–320 Å | 226 Å |

In Table 1 above, it is noted that any of the NbZr layers 11 and 21 may or may not be nitrided and/or oxided in different embodiments of this invention. When NbZr layers in certain example embodiments of this invention are metallic or nitrided, they tend to be thinner (e.g., from 3 to 150 Å, more preferably from 5 to 30 Å thick). However, when they are oxided, they tend to be thicker (e.g., from 10 to 200 Å, more preferably from 10 to 50 Å thick).

In certain example embodiments of this invention, coated articles herein may have the following low-E (low emissivity) characteristics set forth in Table 2 when measured monolithically (before any optional HT). The sheet resistances ($R_s$) herein take into account all IR reflecting layers (e.g., silver layers 9, 19) in the coating, unless expressly stated to the contrary.

TABLE 2

Low-E/Solar Characteristics (Monolithic; pre-HT)

| Characteristic | General | More Preferred |
|---|---|---|
| $R_s$ (ohms/sq.): | <=25.0 | <=5.0 |
| $E_n$: | <=0.20 | <=0.07 |

In certain example embodiments, coated articles herein may have the following characteristics, measured monolithically for example, after HT:

TABLE 3

Low-E/Solar Characteristics (Monolithic; post-HT)

| Characteristic | General | More Preferred |
|---|---|---|
| $R_s$ (ohms/sq.): | <=20 | <=4.5 |
| $E_n$: | <=0.18 | <=0.07 |

In certain example embodiments, coatings herein may possibly even have a sheet resistance ($R_s$) of less than or equal to 3.0 ohms/square, and/or an $E_n$ of less than or equal to 0.04 (before and/or after HT).

Moreover, coated articles including coatings 27 according to certain example embodiments of this invention may have the following optical characteristics (e.g., when the coating(s) is provided on a clear soda lime silica glass substrate 1 from 1 to 10 mm thick) (HT or non-HT). In Table 4, all parameters are to be measured monolithically, unless stated to the contrary. In Table 4 below, $R_gY$ is visible reflection from the glass (g) side of the monolithic article, while $R_fY$ is visible reflection from the side of the monolithic article on which coating/film (f) (i.e., coating 27) is located. It is noted that the SHGC, SC, TS and ultraviolet transmission characteristics are to be in the context of an IG Unit (not monolithic like the rest of the data in Table 4).

TABLE 4

Example Optical Characteristics

| Characteristic | General | More Preferred |
|---|---|---|
| $T_{vis}$ (or TY)(Ill. C, 2 deg.): | >=10% | >=70% |
| $R_gY$ (Ill. C, 2 deg.): | <=20% | <=15% |
| $R_fY$ (Ill. C, 2 deg.): | <=20% | <=15% |
| $T_{ultraviolet}$ (IG): | <=50% | <=45% |
| SHGC (surface #2) (IG): | <=0.55 | <=0.50 |
| SC (#2) (IG): | <=0.60 | <=0.55 |
| TS% (IG): | <=45% | <=43% |

Figure 3:
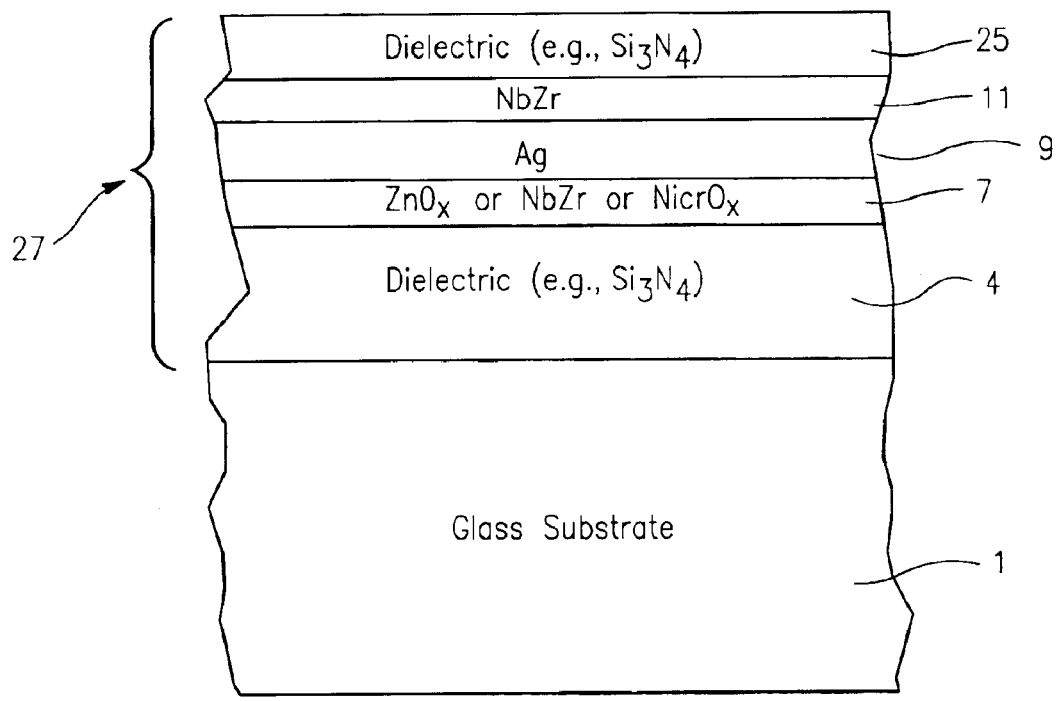
FIG. 3 is a cross sectional view of a coated article according to another example embodiment of this invention.

FIG. 3 illustrates a coated article according to another example embodiment of this invention. The FIG. 3 coated article represents a single silver layer stack, whereas the FIG. 1 coated article represents a double silver layer stack. The coating of FIG. 3 is similar to that of FIG. 1 in that it includes dielectric layer 4 (e.g., silicon nitride or some other dielectric such as a metal oxide and/or metal nitride), lower contact layer 7 (e.g., of or including NbZr, $NbZrO_x$, $NbZrN_x$, NiCr, Nb, $NiCrO_x$, $ZnO_x$, $ZnAlO_x$, Ni, Cr and/or the like), IR reflecting layer 9 (e.g., of or including Ag, Au or the like), upper contact layer 11 comprising NbZr (which may or may not be nitrided and/or oxided in different embodiments of this invention), and upper dielectric layer 25 (e.g., silicon nitride or some other dielectric such as a metal oxide and/or metal nitride) described above. The other layers from the FIG. 1 embodiment need not be used in the FIG. 3 embodiment. As with all other embodiments herein, the coated article shown in FIG. 3 may be used in any suitable context including but not limited to IG window units, laminated window units, monolithic window units, or the like.

In the FIG. 3 embodiment, the use of NbZr in the contact layer(s) 7 and/or 11 allows the layer(s) and resulting coated article to realize improved chemical resistance, without adversely affecting thermal performance or optical characteristics of the coating in a significant way and potentially improving thermal performance characteristics.

The FIG. 3 embodiment is provided for the purposes of illustrating the use of a NbZr inclusive layer(s) in a single IR reflecting layer coating. The materials and number of layers in FIG. 3 are not intended to be limiting, but instead are provided for purposes of example only. Other layers and/or materials may be provided and/or omitted from the FIG. 3 embodiment.

Figure 4:
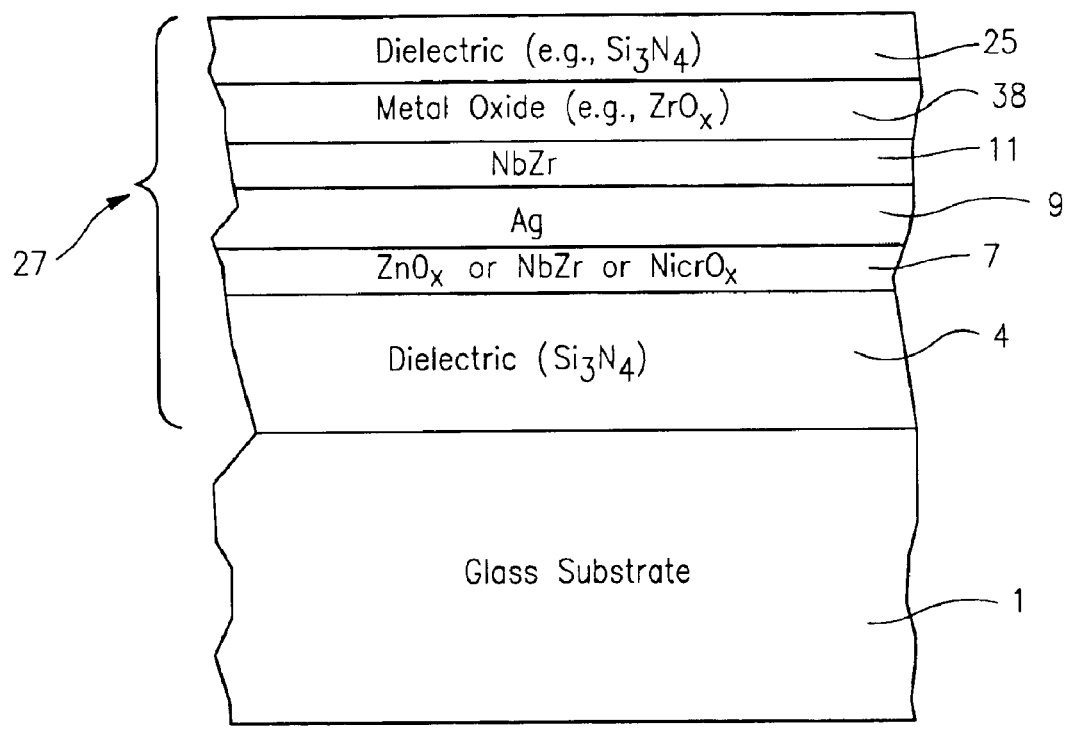
FIG. 4 is a cross sectional view of a coated article according to yet another example embodiment of this invention.

FIG. 4 illustrates a coated article according to another example embodiment of this invention. The coating of FIG. 4 is similar to the embodiment of FIG. 3, except that the FIG. 4 embodiment further includes a metal oxide layer 38 provided over the NbZr inclusive contact layer 11. The metal oxide layer 38 in FIG. 4 may be of or include zirconium oxide, tin oxide, or any other suitable metal oxide.

EXAMPLES

The following examples are to be formed via sputtering and are provided for purposes of example only, and are not intended to be limiting.

Example 1

In Example 1, a metallic NbZr layer was deposited via sputtering using a power of 1.0 kW, a voltage of 369 V, a line speed of 31 inches per minute, and argon (Ar) gas flow of 30 sccm (using an ILS lab coater). After two passes, this resulted in a NbZr layer about 200 Å thick. This may be too thick for a contact layer, but may well be used for an IR reflecting layer in a solar control coating. Further details concerning such NbZr inclusive layers according to such embodiments are described in U.S. Ser. No. 10/423,058, filed Apr. 25, 2003, the disclosure of which is hereby incorporated herein by reference.

Example 2

In hypothetical Example 2, a layer stack is set forth below with the layers in the stack being listed from the glass substrate outwardly (thicknesses in angstroms):

TABLE 5

Layer Stack for Example 2

| Layer | Thickness |
|---|---|
| Glass Substrate | about 3 to 3.4 mm |
| $TiO_x$ | 40 Å |
| $Si_xN_y$ | 113 Å |
| $ZnAlO_x$ | 100 Å |
| Ag | 95 Å |
| $NbZrO_x$ | 26 Å |
| $SnO_2$ | 483 Å |

TABLE 5-continued

Layer Stack for Example 2

| Layer | Thickness |
|---|---|
| $Si_xN_y$ | 113 Å |
| $NbZrN_x$ | 15 Å |
| Ag | 131 Å |
| NbZr | 12 Å |
| $SnO_2$ | 100 Å |
| $Si_3N_4$ | 226 Å |

An example process which may be used to form the coated article of Example 2 is set forth below. For this hypothetical process, the gas flows (argon (Ar), oxygen (O), and nitrogen (N)) in the below table are in units of ml/minute, and include both tuning gas and gas introduced through the main. The λ setting in the sputter coater is in units of mV, and as will be appreciated by those skilled in the art is indicative of the partial pressure of the gas being used in the sputter chamber (i.e., a lower λ setting indicates a higher oxygen gas partial pressure). Thus, for example, a lower λ setting in the case of depositing a ZnAlO layer would mean a higher oxygen gas partial pressure which in turn would mean a less metallic (more oxidized) ZnAlO layer. The linespeed could be about 5 m/min. The pressures are in units of mbar×$10^{-3}$. The silicon (Si) targets, and thus the silicon nitride layers, are doped with about 10% aluminum (Al), so as to be indicated by SiAl targets. The Zn targets in a similar manner are also doped with Al, so as to be indicated by ZnAl targets. It can be seen in Table 6 that the targets used in sputtering the layers comprising niobium zirconium are of or include Nb and Zr.

TABLE 6

Example Sputtering Process for Example 2

| Cathode | Target | Power (kW) | Ar | O | N | λ Setting | Pressure |
|---|---|---|---|---|---|---|---|
| C11 | Ti | 34.6 | 350 | 21.6 | 0 | n/a | 3.65 |
| C12 | Ti | 35.4 | 350 | 4.56 | 0 | n/a | 4.56 |
| C15 | SiAl | 52.2 | 250 | 0 | 305 | n/a | 4.38 |
| C24 | ZnAl | 43 | 250 | 556 | 0 | 175 | 5.07 |
| C32-a | Ag | 3.1 | 250 | 0 | 0 | 0 | 3.69 |
| C32-b | Ag | 3.2 | n/a | 0 | 0 | 0 | n/a |
| C33 | NbZr | 15.7 | 212 | 96 | 0 | 0 | 3.07 |
| C41 | Sn | 46.8 | 200 | 651 | 75 | 171.4 | 5.30 |
| C42 | Sn | 44.2 | 200 | 651 | 75 | 171.4 | 6.68 |
| C43 | Sn | 45.2 | 200 | 651 | 75 | 171.4 | 6.40 |
| C44 | Sn | 49.9 | 200 | 651 | 75 | 171.4 | 6.69 |
| C45 | Sn | 39.8 | 200 | 651 | 75 | 171.4 | 5.17 |
| C52 | SiAl | 51.5 | 250 | 0 | 322 | n/a | 4.11 |
| C55 | NbZr | 10.0 | 250 | 0 | 200 | n/a | 4.37 |
| C62-a | Ag | 4.5 | 250 | 0 | 0 | n/a | 3.43 |
| C62-b | Ag | 4.6 | n/a | 0 | 0 | n/a | n/a |
| C64 | NbZr | 5.5 | 250 | 0 | 0 | n/a | 4.23 |
| C71 | Sn | 41.9 | 200 | 765 | 75 | 172 | 5.29 |
| C73 | SiAl | 54.6 | 225 | 0 | 430 | n/a | 3.93 |
| C74 | SiAl | 53.3 | 225 | 0 | 430 | n/a | 5.86 |
| C75 | SiAl | 54.4 | 225 | 0 | 430 | n/a | 2.52 |

Example 2 makes clear that any of the layers comprising niobium zirconium may be metallic, or alternatively may be at least partially oxided and/or nitrided in different embodiments of this invention. In certain example embodiments, one layer comprising niobium zirconium on one side of an IR reflecting layer may be more oxidized (and/or nitrided) than another layer comprising niobium zirconium provided on the other side of the IR reflecting layer.

Coated articles herein may or may not be heat treated (e.g., heat strengthened, heat bent and/or thermally tempered) in different embodiments of this invention.

Certain terms are prevalently used in the glass coating art, particularly when defining the properties and solar management characteristics of coated glass. Such terms are used herein in accordance with their well known meaning. For a detailed discussion of example meanings, see U.S. patent application Ser. No. 10/400,080, filed Mar. 27, 2003, the disclosure of which is herein incorporated herein by reference.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A coated article including a layer system supported by a substrate, the layer system comprising:
    at least first and second dielectric layers;
    an infrared (IR) reflecting layer comprising silver located between at least the first and second dielectric layers;
    a layer comprising niobium zirconium located adjacent and contacting the IR reflecting layer; and
    wherein the layer comprising niobium zirconium is at least partially nitrided.

2. The coated article of claim 1, wherein each of the dielectric layers comprises at least one of a nitride and a metal oxide.

3. The coated article of claim 1, wherein at least one of the first and second dielectric layers comprises silicon nitride.

4. A coated article including a layer system supported by a substrate, the layer system comprising:
    at least first and second dielectric layers;
    an infrared (IR) reflecting layer comprising silver located between at least the first and second dielectric layers;
    a layer comprising niobium zirconium located adjacent and contacting the IR reflecting layer; and
    wherein each of the first and second dielectric layers comprises silicon nitride doped with aluminum.

5. The coated article of claim 1, further comprising another layer comprising niobium zirconium, wherein the IR reflecting layer comprising silver is sandwiched between and contacts each of the respective layers comprising niobium zirconium.

6. A coated article including a layer system supported by a substrate, the layer system comprising:
    at least first and second dielectric layers;
    an infrared (IR) reflecting layer comprising silver located between at least the first and second dielectric layers;
    a layer comprising niobium zirconium located adjacent and contacting the IR reflecting layer;
    another layer comprising niobium zirconium, wherein the IR reflecting layer comprising silver is sandwiched between and contacts each of the respective layers comprising niobium zirconium; and
    wherein one of the layers comprising niobium zirconium is more oxidized than the other of the layers comprising niobium zirconium.

7. The coated article of claim 4, wherein the layer comprising niobium zirconium is at least partially oxided.

8. The coated article of claim 1, wherein the coated article has a visible transmission of at least 70%.

9. The coated article of claim 1, wherein the coated article is a window.

10. The coated article of claim 1, wherein the coated article has a visible transmission of at least 10%.

11. The coated article of claim 1, wherein the layer system has a sheet resistance ($R_s$) of less than or equal to 20 ohms/square.

12. A coated article including a layer system supported by a substrate, the layer system comprising:
   at least first and second dielectric layers;
   an infrared (IR) reflecting layer comprising silver located between at least the first and second dielectric layers;
   a layer comprising niobium zirconium located adjacent and contacting the IR reflecting layer; and
   a layer comprising a metal oxide located over and directly contacting said layer comprising niobium zirconium.

13. The coated article of claim 12, wherein said metal oxide comprises zirconium oxide.

14. The coated article of claim 1, wherein the layer comprising niobium zirconium is nitrided so as to be represented by $(Nb+Zr)_xN_y$, where the ratio y/x (i.e., the ratio of N to Nb+Zr) is from 0.2 to 0.9.

15. The coated article of claim 14, wherein the ratio y/x is from 0.3 to 0.8.

16. A coated article including a layer system supported by a substrate, the layer system comprising:
   at least first and second dielectric layers;
   an infrared (IR) reflecting layer comprising silver located between at least the first and second dielectric layers;
   a layer comprising niobium zirconium located adjacent and contacting the IR reflecting layer; and
   wherein in the layer comprising niobium zirconium the ratio of zirconium to niobium (Zr/Nb) is from about 0.001 to 1.0.

17. The coated article of claim 16, wherein in the layer comprising niobium zirconium the ratio of zirconium to niobium (Zr/Nb) is from about 0.001 to 0.60.

18. The coated article of claim 16, wherein in the layer comprising niobium zirconium the ratio of zirconium to niobium (Zr/Nb) is from about 0.004 to 0.50.

19. A coated article including a layer system supported by a substrate, the layer system comprising:
   at least first and second dielectric layers;
   an infrared (IR) reflecting layer comprising silver located between at least the first and second dielectric layers;
   a layer comprising niobium zirconium located adjacent and contacting the IR reflecting layer; and
   wherein the layer comprising niobium zirconium includes from about 0.1 to 60% zirconium.

20. The coated article of claim 19, wherein the layer comprising niobium zirconium includes from about 3 to 12% zirconium.

21. A coated article including a layer system supported by a substrate, the layer system comprising:
   at least first and second dielectric layers;
   an infrared (IR) reflecting layer comprising silver located between at least the first and second dielectric layers;
   a layer comprising niobium zirconium located adjacent and contacting the IR reflecting layer; and
   wherein the layer comprising niobium zirconium is metallic.

22. A coated article including a layer system supported by a substrate, the layer system comprising:
   at least first and second dielectric layers;
   an infrared (IR) reflecting layer comprising silver located between at least the first and second dielectric layers;
   a layer comprising niobium zirconium located adjacent and contacting the IR reflecting layer; and
   wherein the layer comprising niobium zirconium consists essentially of niobium and zirconium.

23. The coated article of claim 16, wherein the coated article comprises an IG window unit, a monolithic window, or a laminated window.

24. A coated article including a layer system supported by a substrate, the layer system comprising:
   at least first and second dielectric layers;
   an infrared (IR) reflecting layer comprising silver located between at least the first and second dielectric layers;
   a layer comprising niobium zirconium located adjacent and contacting the IR reflecting layer; and
   wherein the layer comprising niobium zirconium is substantially free of any oxide.

25. A coated article including a layer system supported by a substrate, the layer system comprising:
   at least first and second dielectric layers;
   an infrared (IR) reflecting layer comprising silver located between at least the first and second dielectric layers;
   a layer comprising niobium zirconium located adjacent and contacting the IR reflecting layer; and
   wherein at least one of the dielectric layers comprises silicon nitride and includes from 6–20% aluminum and/or stainless steel.

26. The coated article of claim 1, further comprising at least two additional layers each comprising niobium zirconium so that the layer system includes at least three layers comprising niobium zirconium, wherein each of the three layers comprising niobium zirconium contacts a layer comprising silver, and wherein two of the three layers comprising niobium zirconium contact the same layer comprising silver.

27. The coated article of claim 1, wherein the coated article is heat treated.

28. The coated article of claim 1, wherein the substrate is a glass substrate.

29. A coated article including a layer system supported by a substrate, the layer system comprising:
   an infrared (IR) reflecting layer located between at least first and second other layers;
   a layer comprising niobium zirconium located adjacent to and contacting the IR reflecting layer; and
   wherein the coated article is characterized by one or more of: (a) the layer comprising niobium zirconium is at least partially nitrided, (b) the layer comprising niobium zirconium consists essentially of niobium and zirconium, (c) the layer comprising niobium zirconium includes from 0.1 to 60% zirconium, and (d) in the layer comprising niobium zirconium the ratio of Zr/Nb is from about 0.001 to 1.0.

30. The coated article of claim 29, wherein the IR reflecting layer comprises Ag and/or Au.

31. The coated article of claim 29, wherein the IR reflecting layer is metallic.

32. The coated article of claim 29, wherein the layer comprising niobium zirconium is at least partially oxided and/or nitrided.

33. The coated article of claim 29, wherein the layer comprising niobium zirconium is metallic.

34. The coated article of claim 29, wherein each of the other layers is a dielectric layer comprising at least one of a nitride and a metal oxide.

35. A coated article including a layer system supported by a glass substrate, the layer system comprising:
   a layer comprising an oxide of niobium zirconium supported by the glass substrate; and
   wherein the layer comprising the oxide of niobium zirconium has an index of refraction "n" of from 2.0 to 3.4, and comprises from about 0.1 to 60% Zr.

36. The coated article of claim 35, wherein the layer comprising the oxide of niobium zirconium comprises from 0.1 to 20% Zr.

37. The coated article of claim 35, wherein the layer comprising the oxide of niobium zirconium comprises from 0.4 to 15% Zr.

38. The coated article of claim 35, wherein the layer comprising the oxide of niobium zirconium is located between at least first and second nitride and/or metal oxide layers.

39. The coated article of claim 29, wherein the layer comprising niobium zirconium is at least partially nitrided and has an index of refraction "n" of from 2.0 to 3.4, and an extinction coefficient "k" of from 2.0 to 3.5, and comprises from about 0.1 to 60% Zr.

40. The coated article of claim 35, wherein the layer comprising the oxide of niobium zirconium contacts a layer comprising Au and/or Ag.

41. A coated article including a coating supported by a substrate, comprising:

at least first and second dielectric layers;

a metal inclusive layer located between at least the first and second dielectric layers;

a layer comprising niobium zirconium located adjacent and contacting the metal inclusive layer; and wherein the layer comprising niobium zirconium is at least partially nitrided.

42. The coated article of claim 41, wherein the layer comprising niobium zirconium is at least partially oxided.

43. The coated article of claim 41, wherein the metal inclusive layer comprises one of Ag and Au.

44. The coated article of claim 35, wherein the coated article is a window.

* * * * *